(12) United States Patent
Zhang

(10) Patent No.: US 11,881,478 B2
(45) Date of Patent: Jan. 23, 2024

(54) HIGH ELECTRON MOBILITY TRANSISTOR DEVICE AND METHOD FOR MANUFACTURING THE SAME

(71) Applicant: INNOSCIENCE (ZHUHAI) TECHNOLOGY CO., LTD., Zhuhai (CN)

(72) Inventor: Anbang Zhang, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 804 days.

(21) Appl. No.: 16/975,720

(22) PCT Filed: Jul. 1, 2020

(86) PCT No.: PCT/CN2020/099697
§ 371 (c)(1),
(2) Date: Aug. 26, 2020

(65) Prior Publication Data
US 2022/0375922 A1    Nov. 24, 2022

(51) Int. Cl.
| | |
|---|---|
| H01L 27/02 | (2006.01) |
| H01L 23/48 | (2006.01) |
| H01L 29/20 | (2006.01) |
| H01L 29/66 | (2006.01) |
| H01L 29/778 | (2006.01) |

(52) U.S. Cl.
CPC ........ *H01L 27/0248* (2013.01); *H01L 23/481* (2013.01); *H01L 29/2003* (2013.01); *H01L 29/66462* (2013.01); *H01L 29/7787* (2013.01)

(58) Field of Classification Search
None
See application file for complete search history.

(56) References Cited

U.S. PATENT DOCUMENTS

| | | | | |
|---|---|---|---|---|
| 9,356,017 | B1* | 5/2016 | Siemieniec | ......... H01L 29/7786 |
| 2014/0353724 | A1* | 12/2014 | Fujita | .................. H01L 29/6606 |
| | | | | 257/195 |
| 2015/0372096 | A1 | 12/2015 | Shih et al. | |
| 2017/0258376 | A1* | 9/2017 | Ram | ........................ A61B 5/02 |
| 2018/0240791 | A1 | 8/2018 | Jeon | |

FOREIGN PATENT DOCUMENTS

| | | |
|---|---|---|
| CN | 105871365 A | 8/2016 |
| CN | 107046030 A | 8/2017 |
| CN | 110676315 A | 1/2020 |

OTHER PUBLICATIONS

International Search Report and Written Opinion of the corresponding PCT application No. PCT/CN2020/099697 dated Mar. 25, 2021.
Jung-Tao Chung et al., "ESD Protection Device for HEMT MMICs", CS Mantech Conference, May 18-21, 2015, p. 283-286, Session 14.

* cited by examiner

*Primary Examiner* — Nduka E Ojeh
(74) *Attorney, Agent, or Firm* — JCIPRNET

(57) ABSTRACT

An electronic device includes a substrate, a transistor and a doped well. The substrate includes a first region and a second region different from the first region. The transistor is disposed on the first region of the substrate. The transistor includes a first nitride semiconductor layer disposed on the substrate, and a second nitride semiconductor layer disposed on the first nitride semiconductor layer. The second nitride semiconductor layer has a bandgap greater than that of the first nitride semiconductor layer. The doped well is disposed in the second region.

19 Claims, 10 Drawing Sheets

HIGH ELECTRON MOBILITY TRANSISTOR DEVICE AND METHOD FOR MANUFACTURING THE SAME

BACKGROUND

1. Field of the Disclosure

The disclosure relates to an electronic device, and particularly to a group III-V electronic device having an ESD protection circuit.

2. Description of the Related Art

Components including heterostructure semiconductors, for example, semiconductor components including group III-V materials or group III-V compounds (Category: III-V compounds) can operate or work under a variety of conditions or in a variety of environments (e.g., at different voltages and frequencies) due to their characteristics.

SUMMARY

Semiconductor components, such as high-electron-mobility transistors (HEMTs), have been widely used in different electronic device, such as power switches and amplifiers. Suitable electronic discharge (ESD) protection devices for semiconductor components are highly desired.

In some embodiments, an electronic device includes a substrate, a transistor and a doped well. The substrate includes a first region and a second region different from the first region. The transistor is disposed on the first region of the substrate. The transistor includes a first nitride semiconductor layer disposed on the substrate, and a second nitride semiconductor layer disposed on the first nitride semiconductor layer. The second nitride semiconductor layer has a bandgap greater than that of the first nitride semiconductor layer. The doped well is disposed in the second region.

In some embodiments, an electronic device includes a semiconductor substrate, a semiconductor heterostructure layer, and a doped well. The semiconductor heterostructure layer includes an implanted area. The semiconductor hetrostructure layer includes an implanted area. The doped well is disposed in the semiconductor substrate under the implanted area of the semiconductor heterostructure layer. The semiconductor substrate and the doped well have different types of semiconductors.

In some embodiments, a method for manufacturing an electronic device includes forming a group III nitride semiconductor heterostructure layer on a substrate, implanting a first dopant in the first region of the substrate to form a first doped well, implanting a second dopant in the group III nitride semiconductor heterostructure layer above the first region, forming a via through the group III nitride semiconductor heterostructure layer until the first doped well; and at least partially filling the via to form an interconnect for electrically connecting the first doped well.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
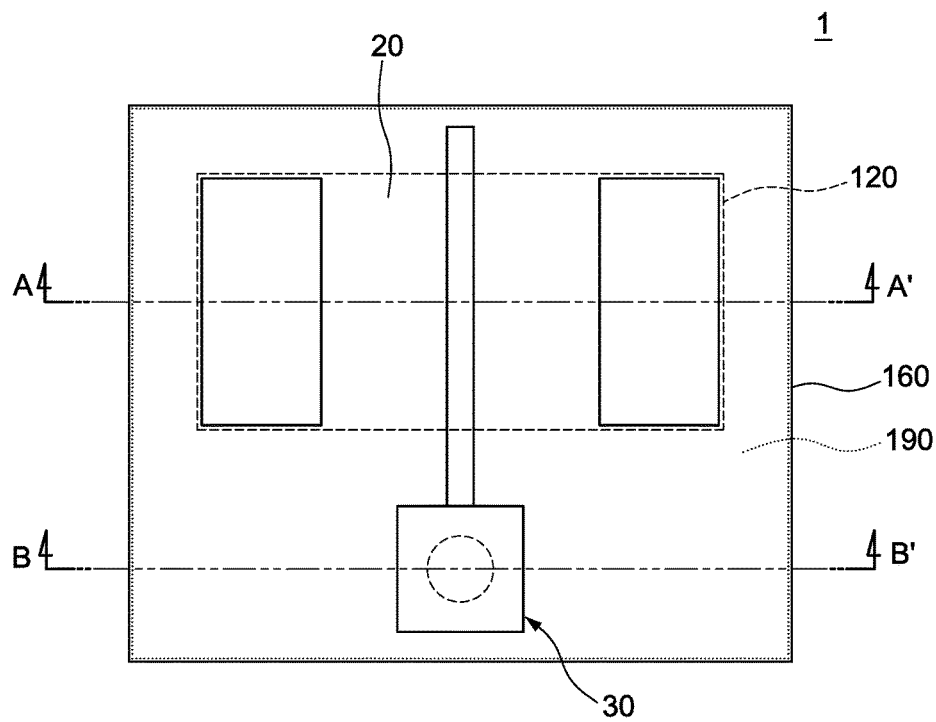
FIG. 1A is a top view of an electronic device in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A illustrates a top view of a schematic diagram of an electronic device 1, in accordance with some embodiments of the present disclosure.

Referring to FIG. 1A, the electronic device 1 may include a transistor 20 and an ESD protecting structure 30 to protect the transistor 20 from damage caused by ESD.

The transistor 20 may include a GaN-based HEMT. The electronic devices of the present disclosure can be applied in, without limitation, HEMT devices, low voltage HEMT devices, high voltage HEMT devices and radio frequency (RF) HEMT devices.

In some comparative embodiments, an ESD protecting circuit and a transistor, which is protected by the ESD protecting circuit, are two discrete devices and electrically connected to each other at the packaging level (not shown in the drawings). In some other comparative embodiments, the ESD protecting circuit and the transistor, which is protected by the ESD protecting circuit, are discretely disposed on a circuit board and electrically connected to each other. It is contemplated that, the ESD protecting structure 30 and the transistor 20 depicted in FIG. 1A are integrated within an integrated circuit (IC) chip. The ESD protecting structure 30 is built in the IC. The ESD protecting structure 30 can be formed adjacent to the transistor 20 or other electronic device for protection. A total area of an IC including an electronic device with ESD protection can be reduced, and a density of the IC can be increased.

Figure 1B:
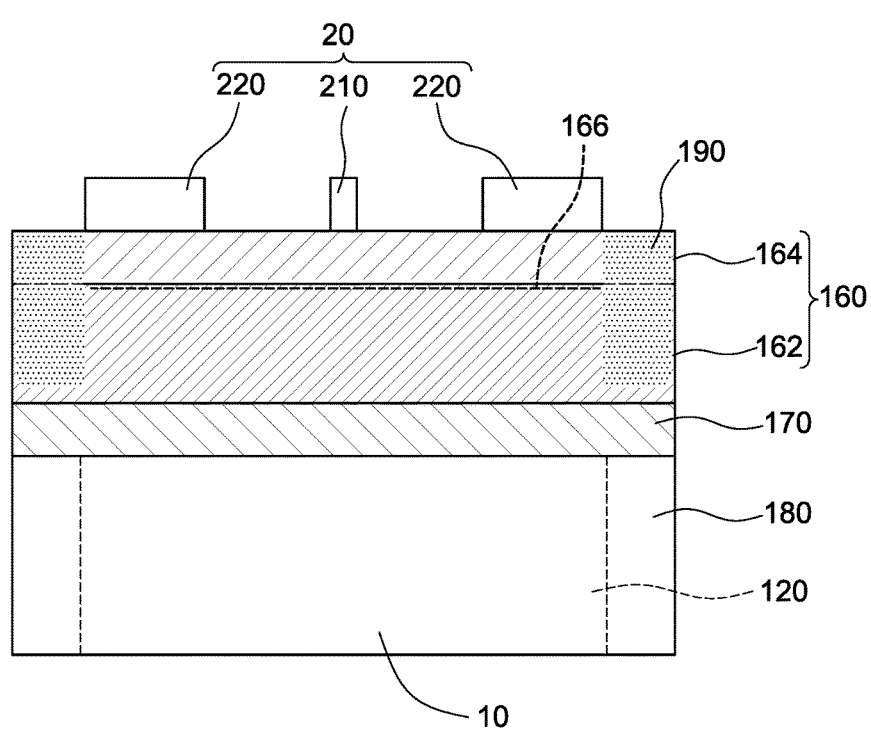
FIG. 1B is a cross-sectional view of the electronic device of FIG. 1A along line A-A'.

FIG. 1B illustrates a cross-sectional view of an electronic device 100 of FIG. 1A along line A-A'. Referring to FIG. 1B, the electronic device 1 includes a substrate 10. The substrate 10 may be a bulk semiconductor substrate. The substrate 10 may be a silicon substrate. Alternatively, the substrate 10 may comprise another elementary semiconductor, such as germanium, or a compound semiconductor including silicon carbide, gallium arsenide, gallium phosphide, indium phosphide, indium arsenide, and indium antimonide; an alloy semiconductor, such as SiGe, GaAsP, AlInAs, AlGaAs, GaInAs, GaInP, and GaInAsP; and combinations thereof. The substrate 10 may be a silicon on insulator (SOI), an epitaxial material, or other suitable materials.

The substrate 10 includes a region 120 and a region 180. The region 120 is different from the region 180. The region 120 can be under the transistor 20. The region 120 can be right under the transistor 20. The transistor 20 region 120 can overlap the region 120. The transistor 20 region 120 can overlap a portion of the region 120. The transistor 20 region 120 can overlap the overall region 120. The transistor 20 region 120 can cover a portion of the region 120. The transistor 20 can be disposed on the region 120 of the substrate 20. The region 180 can surround the region 120. The region 120 may be enclosed by the region 180.

The transistor 20 includes semiconductor heterostructure layer 160, which may be a group III nitride semiconductor heterostructure layer. The semiconductor heterostructure layer 160 can be III-V compound layers. The semiconductor heterostructure layer 160 may include nitride semiconductor layer 162 and nitride semiconductor layer 164.

The nitride semiconductor layer 162 is disposed on the substrate 10. The nitride semiconductor layer 162 may include a group III-V layer. The nitride semiconductor layer 162 may include, but is not limited to, a group III nitride, for example, a compound $In_xAl_yGa_{1-x-y}N$, in which x+y≤1. The group III nitride further includes, but is not limited to, for example, a compound $Al_yGa_{(1-y)}N$, in which y≤1. The nitride semiconductor layer 162 includes a gallium nitride (GaN) layer. GaN has a band gap of about 3.4 V. The thickness of the nitride semiconductor layer 162 ranges, but is not limited to, from about 0.5 μm to about 10 μm.

The nitride semiconductor layer 164 is disposed on the nitride semiconductor layer 162. The nitride semiconductor layer 164 may include a group III-V layer. The nitride semiconductor layer 164 may include, but is not limited to, a group III nitride, for example, a compound $In_xAl_yGa_{1-x-y}N$, in which x+y≤1. The group III nitride further includes, but is not limited to, for example, a compound $Al_yGa_{(1-y)}N$, in which y≤1. The nitride semiconductor layer 164 has a greater bandgap than that of the nitride semiconductor layer 162. The nitride semiconductor layer 164 includes an aluminum gallium nitride (AlGaN) layer. AlGaN has a band gap of about 4.0 V. The thickness of the nitride semiconductor layer 164 ranges, but is not limited to, from about 10 nm to about 100 nm.

In the transistor 20, the nitride semiconductor layer 162 can be referred to as a channel layer, and the nitride semiconductor layer 164 can be referred to as a barrier layer. A heterojunction is formed between the nitride semiconductor layer 162 and nitride semiconductor layer 164. Polarization of the heterojunction can form a two-dimensional electron gas (2DEG) 166 in the nitride semiconductor layer 162 adjacent to the interface between nitride semiconductor layer 162 and the nitride semiconductor layer 164. The 2DEG 166 is formed in a layer with a relatively small bandgap, such as the semiconductor layer 162 which includes GaN.

The transistor 20 further includes electrodes 210, 220. The electrode 210 may be referred to as a gate electrode. The electrodes 220 may be referred to as source electrode and a drain electrode. The electrode 210 may be disposed between the source and drain electrodes 220.

The electrode 210 may be disposed on the nitride semiconductor layer 164. The electrode 210 may include, but is not limited to, a gate dielectric layer and a gate conductive structure disposed thereon. The gate dielectric layer may include one or more layers of a dielectric material, such as silicon oxide, silicon nitride, or a high-k dielectric material or other suitable dielectric materials. The gate conductive structure may include titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The electrodes 220 referred to as the source electrode and the drain electrode. The electrodes 220 may include, for example, without limitation, a conductive material. The conductive material may include, but is not limited to, for example, metals, alloys, doped semiconductor materials (e.g., doped crystalline silicon), or other suitable conductor materials.

The electronic device 100 may further include a buffer layer 170. The buffer layer 170 is disposed between the substrate 140 and the nitride semiconductor layer 162. The buffer layer 170 may be configured to reduce defects due to the dislocation between the substrate 140 and the subsequently formed III-V compound layer. The buffer layer 170 may include, but is not limited to, nitride, such as AlN, AlGaN or the like.

Figure 1C:
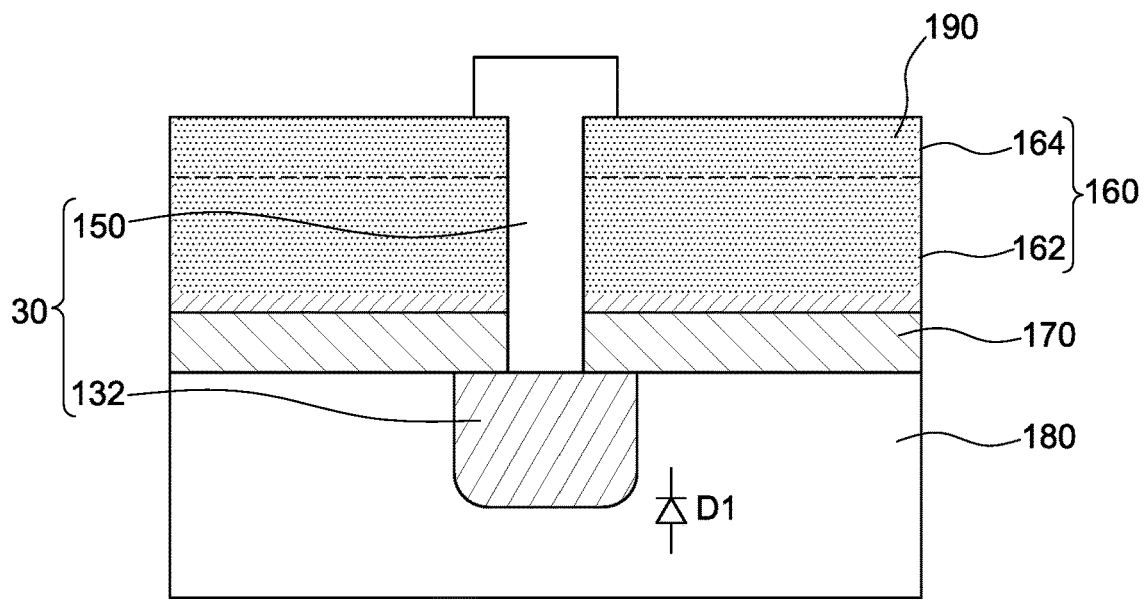
FIG. 1C is a cross-sectional view of the electronic device of FIG. 1A along line B-B'.

FIG. 1C illustrates a cross-sectional view of the electronic device 1 of FIG. 1A along line B-B'. Referring to FIG. 1C, an implanted area 190 can be formed above the region 180 of the substrate. The implanted area 190 can be formed surrounding the transistor 20. The implanted area 190 may surround a portion of heterostructure layer 160 on the region 120. The portion of heterostructure layer 160 on the region 120 may be enclosed by the implanted area 190 above the region 180 of the substrate 10.

In some embodiments, the nitride semiconductor layer 162 on the region 180 of the substrate 140 may be doped with an impurity. In some embodiments, the nitride semiconductor layer 164 on the region 180 of the substrate 140 may be doped with the impurity. In some embodiments, both the semiconductor layer 162 and the nitride semiconductor layer 164 are doped with the impurity. The doped semiconductor heterostructure layer 160 forms an implanted area 190.

The impurity may include nitrogen (N), Zinc (Zn), oxygen (O), or suitable materials.

The dopants in the implanted area 190 of the semiconductor heterostructure layer 160 have a doping concentration in a range from approximately $1 \times 10^{12}$ cm$^{-2}$ to approximately $1 \times 10^{16}$ cm$^{-2}$.

The dopants in the implanted area 190 of the semiconductor heterostructure layer 160 may result in the heterojunction being non-polarized. Thus, no 2DEG can be formed in the heterojunction between the nitride semiconductor layer 162 and the nitride semiconductor layer 164 on the region 180 of the substrate 10. The portion of semiconductor heterostructure layer 160 above the region 120 of the substrate 10 can be isolated by the implanted region 190 of the semiconductor heterostructure layer 160 above the region 180.

Please refer to FIG. 1C again. A doped well 132 can be formed in the region 180 of the substrate 10. The doped well 132 may be under the implanted area 190. The substrate 10 and the doped well 132 have different type of semiconductors. The substrate 10 may be doped with an impurity different from an impurity of the doped well 132. The substrate 10 and the doped well 132 have opposite semiconductor types. For example, the substrate 10 may include an n-type semiconductor, and the doped well 132 may include a p-type semiconductor. Alternatively, the substrate 10 may include a p-type semiconductor, and the doped well 132 may include an n-type semiconductor. Therefore, a PN junction can be formed between the substrate 10 and the doped well 132. The PN junction between the substrate 10 and the doped well 132 may form a diode D1.

The dopant in the doped well 132 has a concentration in a range from approximately $10^{13}$ to approximately $10^{18}$ cm$^{-3}$.

The ESD protecting structure 30 may include diode D1 and a interconnect 150. The doped well 132 can be electrically connected to the electrode 210 of the transistor 20 by the interconnect 150. The interconnect 150 extends from the doped well 132 and penetrates the semiconductor heterostructure layer 160. The interconnect 150 can penetrate the nitride semiconductor layer 162. The interconnect 150 can penetrate the nitride semiconductor layer 164.

The diode D1 can be a reverse biased PN junction diode to form ESD protection for the gate electrode of the transistor 20. The reverse biased P-N junction diode D1 can introduce a leakage path to release the energy, and the voltage across the transistor 20 can be clamped.

Figure 2:
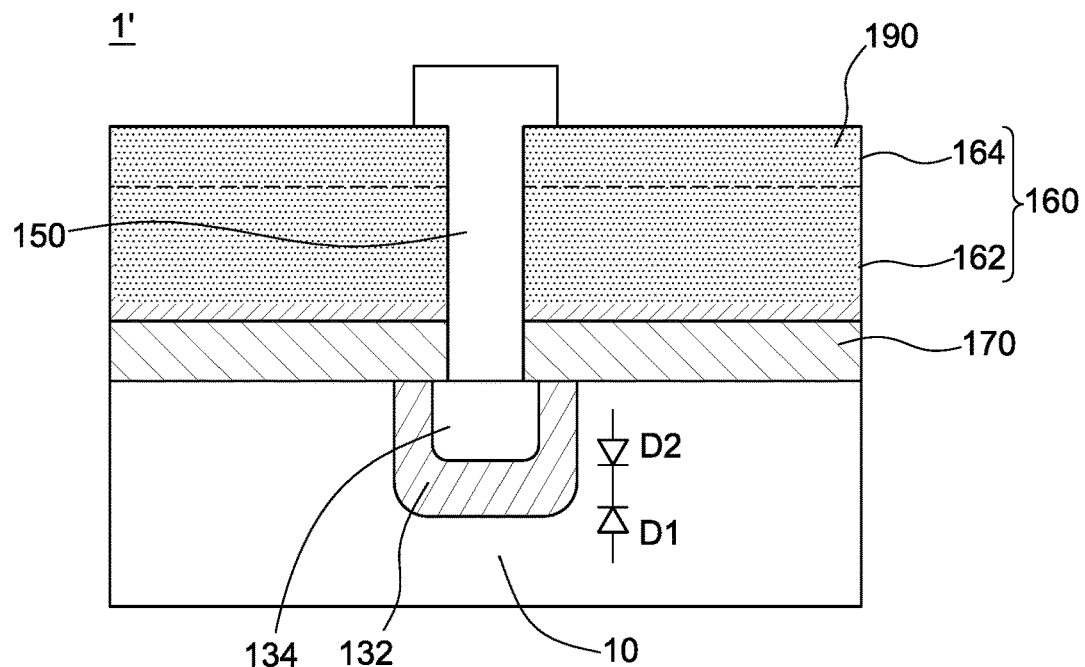
FIG. 2 is a cross-sectional view of an electronic device in accordance with some embodiments of the present disclosure.

FIG. 2 is a cross-sectional view of an electronic device 1' in accordance with some embodiments of the present disclosure. A further doped well 134 can be formed within the doped well 132. The doped well 134 may have an impurity different from the impurity of the doped well 132. The doped well 134 and the doped well 132 have opposite semiconductor types. Therefore, a PN junction can be formed between the doped well 134 and the doped well 132. The PN junction between the doped well 134 and the doped well 132 can form a diode D2.

The dopant in the doped well 134 has a concentration in a range from approximately $10^{13}$ to approximately $10^{18}$ cm$^{-3}$.

In the electronic device 1', the substrate 10 may have dopants to form an n-type semiconductor. The doped well 132 may have dopants to form a p-type semiconductor. A PN junction diode D1 is formed between the n-type semiconductor substrate 10 and the p-type semiconductor doped well 132. The doped well 134 may have dopants to form an n-type semiconductor. A PN junction diode D2 is formed between the p-type semiconductor doped well 132 and the n-type semiconductor doped well 134.

The diode D1 can connect the diode D2 in series. The series-connected PN junction diode D1 and D2 may be formed in opposite directions. The opposite-direction series-connected diodes D1 and D2 can provide bidirectional ESD protection for the transistor 20.

Figure 3:
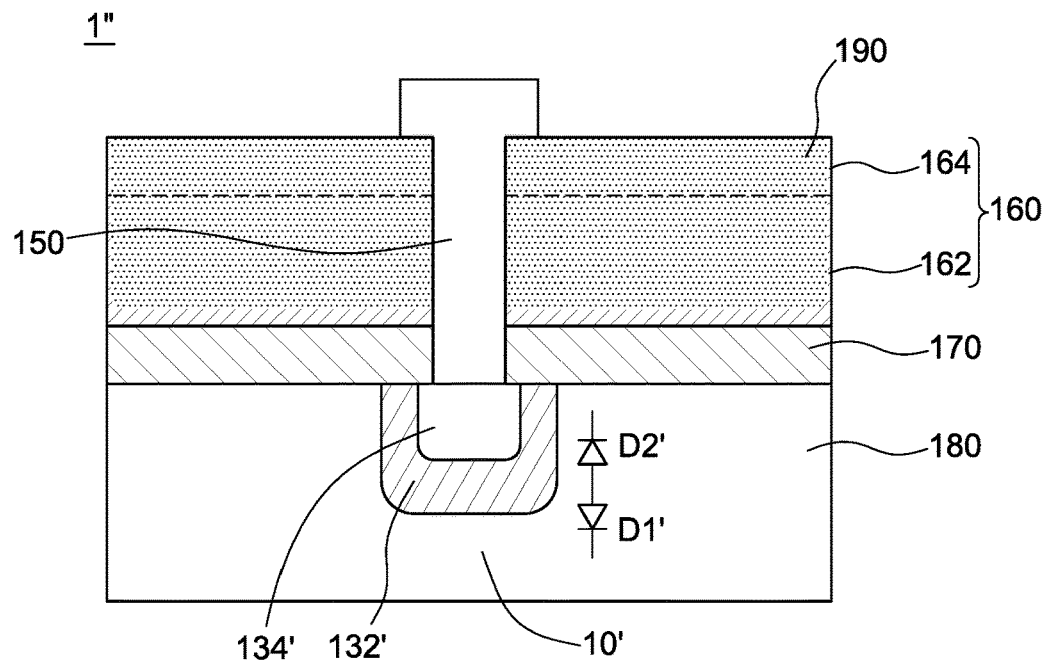
FIG. 3 is a cross-sectional view of an electronic device in accordance with some embodiments of the present disclosure.

FIG. 3 is a cross-sectional view of an electronic device 1" in accordance with some embodiments of the present disclosure. The electronic device 1" includes a substrate 10', a doped well 132' and a doped well 134'.

In the electronic device 1", the substrate 10' may have an impurity to form a p-type semiconductor. The doped well 132' may have dopants to form an n-type semiconductor. A PN junction diode D1' is formed between the p-type semiconductor substrate 10' and the n-type semiconductor doped well 132'. The doped well 134' may have dopants to form a p-type semiconductor. A PN junction diode D2' is formed between the n-type semiconductor doped well 132' and the p-type semiconductor doped well 134'.

In some embodiments, a further doped well may be formed within doped well 134 of the electronic device 1 or the doped well 134' of the electronic device 1' to form multiple series-connected and PN junction diodes. Among the multiple series-connected and PN junction diodes, neighboring PN junction diodes can be arranged in opposite directions.

Figure 4A:
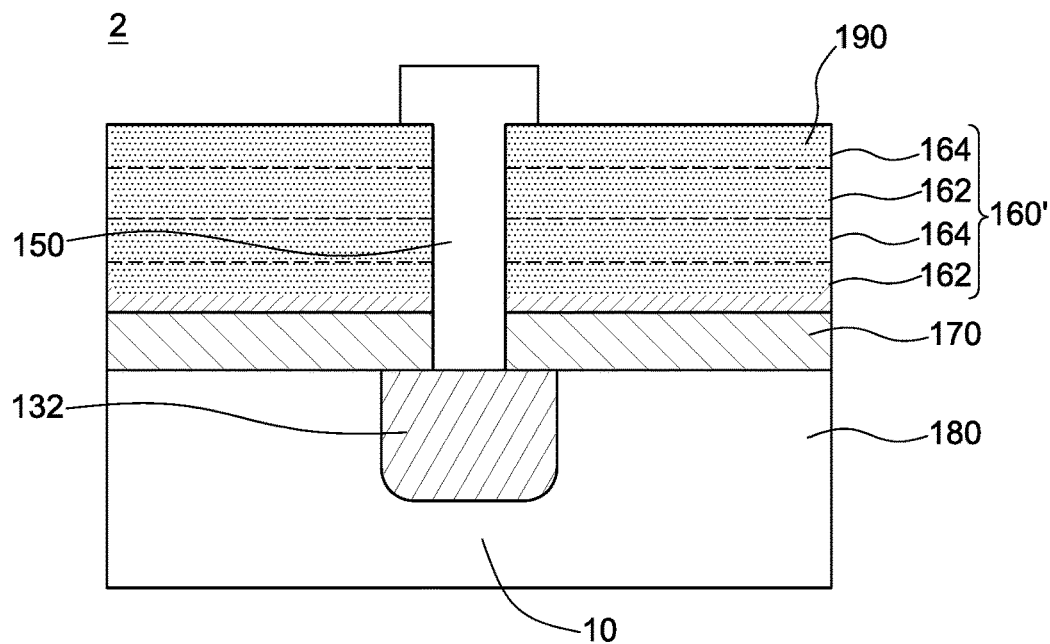
FIG. 4A is a cross-sectional view of an electronic device in accordance with some embodiments of the present disclosure.

FIG. 4A is a cross-sectional view of an electronic device 2 in accordance with some embodiments of the present disclosure. The electronic device 200 has a structure similar to the semiconductor device 1 of FIG. 1, with one difference being that the semiconductor heterostructure layer 160' includes multiple nitride semiconductor layers 162 and the nitride semiconductor layer 164 alternately stacked.

Figure 4B:
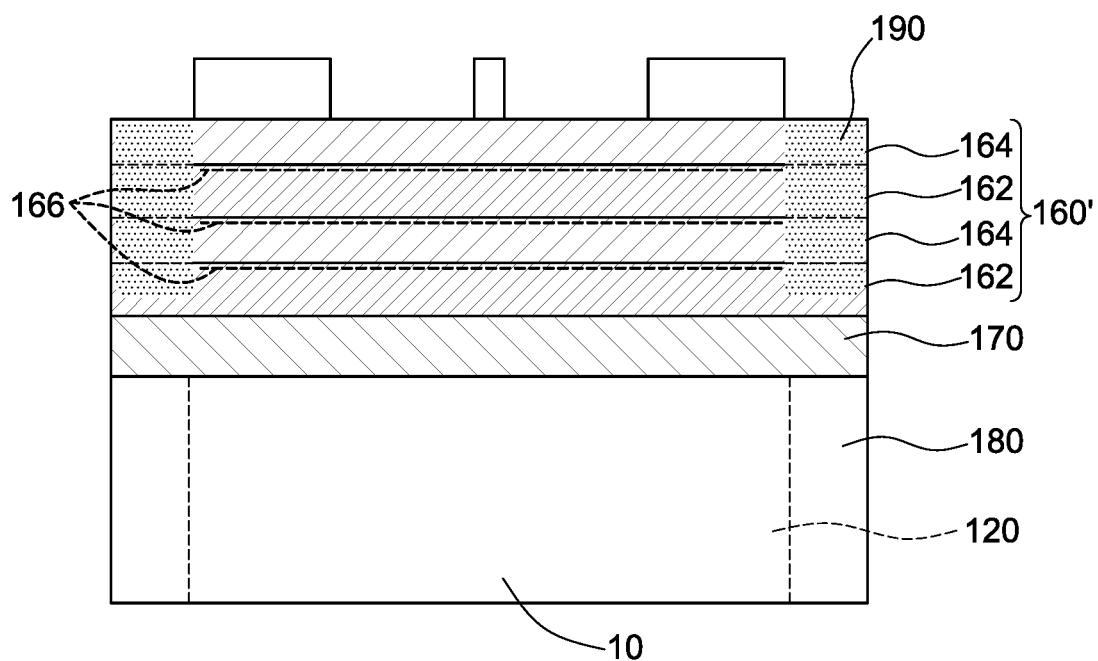
FIG. 4B is a cross-sectional view of an electronic device in accordance with some embodiments of the present disclosure.

FIG. 4B is a cross-sectional view of an electronic device 2 in accordance with some embodiments of the present disclosure. A heterojunction is formed between neighboring nitride semiconductor layer 162 and nitride semiconductor layer 164 on the region 120 of the substrate 10. In the semiconductor heterostructure layer 160' on the region 120, polarization of the heterojunction can form two-dimensional electron gas (2DEG) 166. The 2DEGs 166 are formed in the layers with a relatively small bandgap, such as the semiconductor layers 162 which include GaN. Multiple 2DEGs can enhance distribution of electron flow to avoid electron crowding.

FIG. 5, FIG. 6A, FIG. 7, FIG. 8A, FIG. 9A and FIG. 10A, illustrate various steps of a method for manufacturing an electronic device 1 in accordance with some embodiments of the present disclosure.

Figure 5:
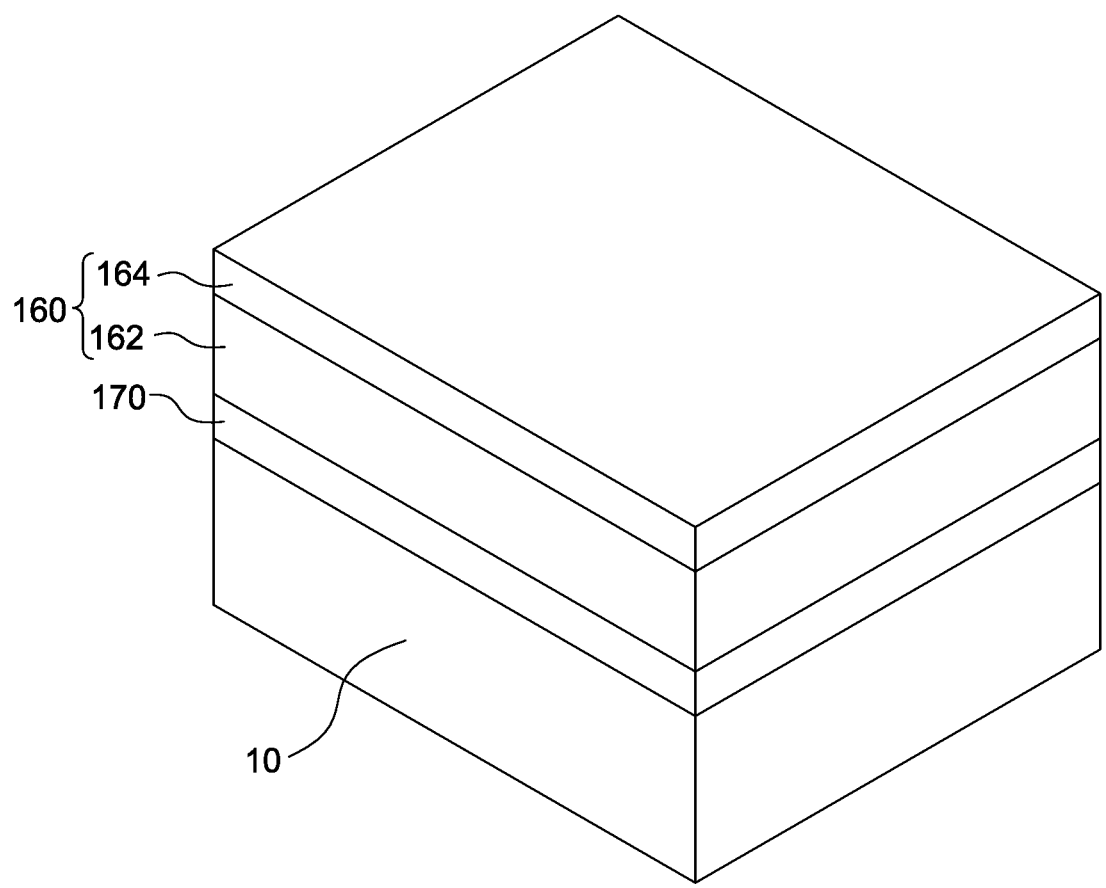
FIG. 5 illustrates a step of a method for manufacturing an electronic device in accordance with some embodiments of the present disclosure.

Referring to FIG. 5, a substrate 10 is provided. A buffer layer 170, a group III nitride semiconductor hetrostructure layer 160 can be formed on the substrate 10. The group III nitride semiconductor hetrostructure layer 160 may include a nitride semiconductor layer 162 and a nitride semiconductor layer 164 form a semiconductor heterostructure layer 160. The buffer layer 170, nitride semiconductor layer 162 and/or nitride semiconductor layer 164 may be formed by metal organic chemical vapor deposition (MOCVD), metal organic vapor-phase epitaxy (MOVPE), epitaxial growth, or other suitable processes.

Figure 6A:
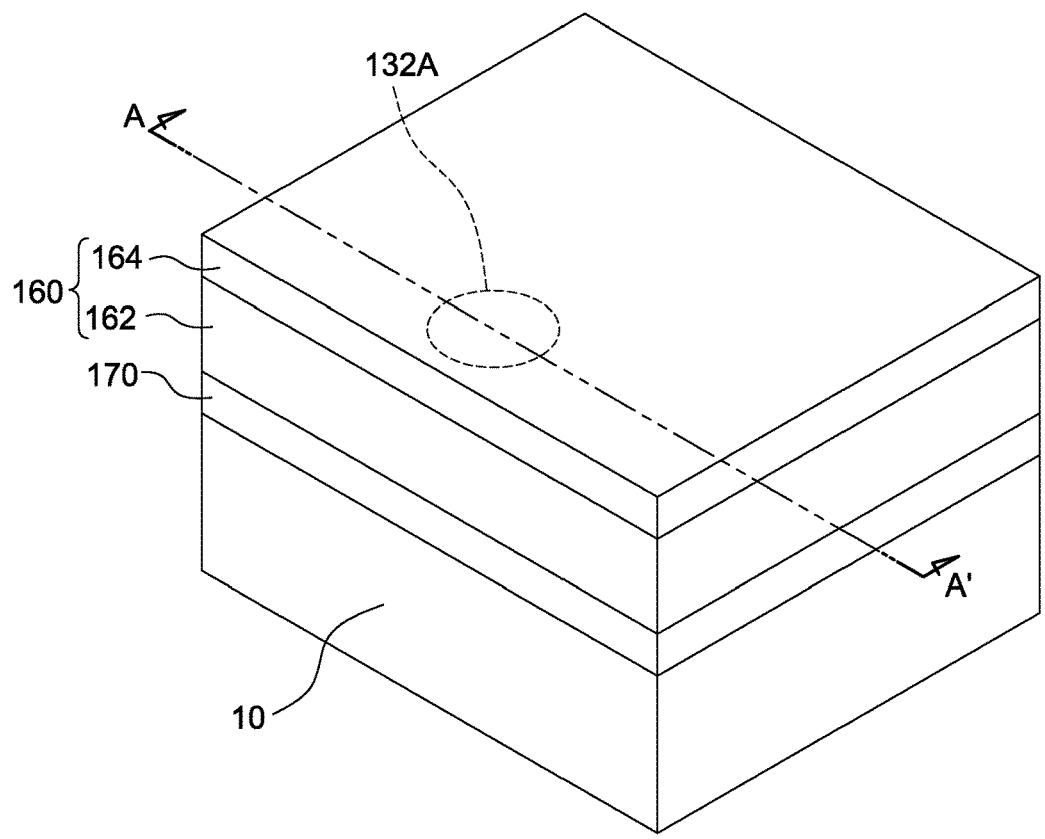
FIG. 6A illustrates a step of a method for manufacturing an electronic device in accordance with some embodiments of the present disclosure.
Figure 6B:
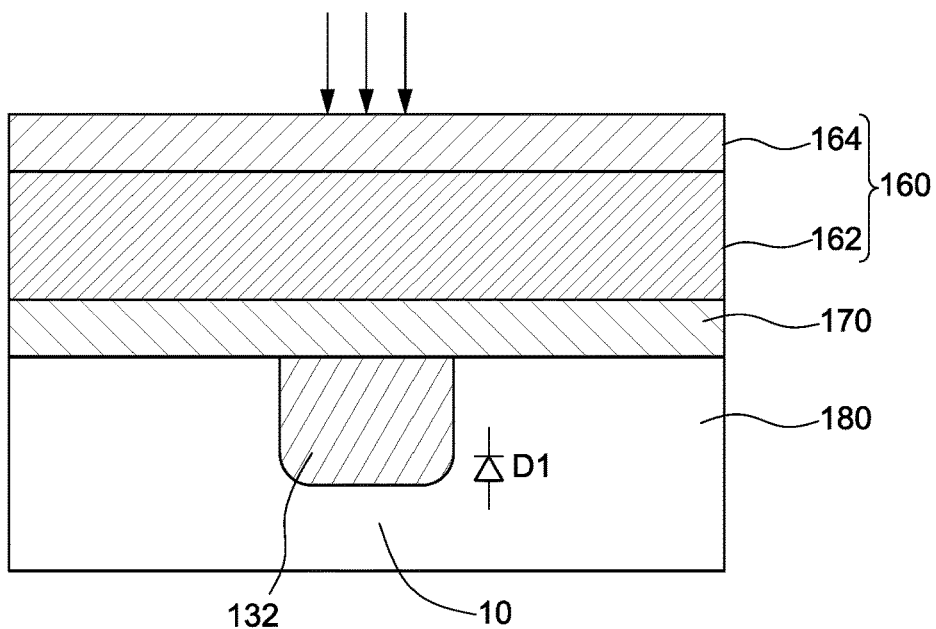
FIG. 6B illustrate a cross-sectional view of FIG. 6A along line A-A' in FIG. 6A.

Referring to FIG. 6A and FIG. 6B, dopants are implanted into the substrate 10 within an area 132A to form a doped well 132. FIG. 6B illustrate a cross-sectional view of FIG. 6A along line A-A' in FIG. 6A.

Figure 6C:
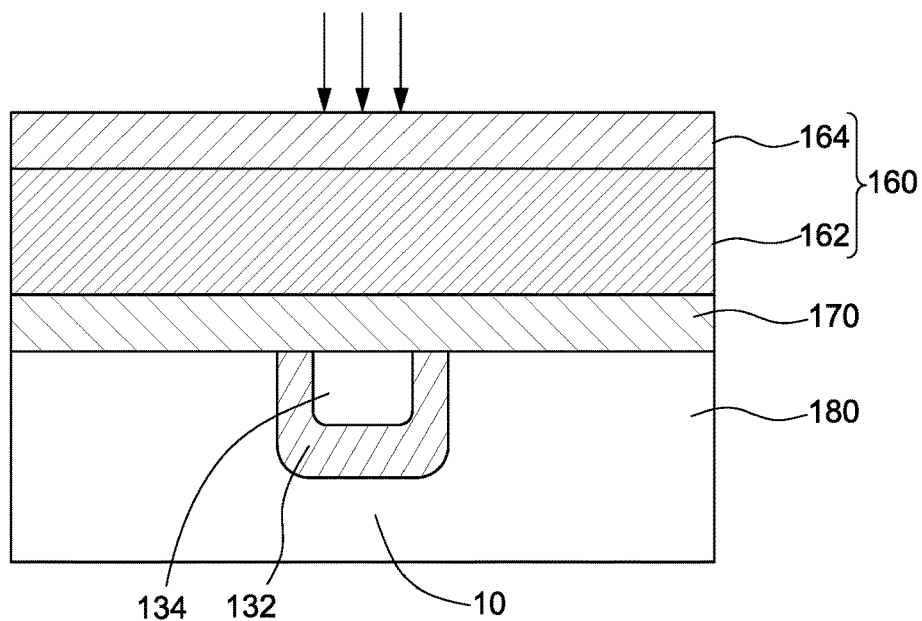
FIG. 6C illustrate a cross-sectional view of FIG. 6A along line A-A' in FIG. 6A.

Referring to FIG. 6C, in some embodiments, additional dopants may be further implanted into the substrate 10 within the doped well 132 to form a doped well 134. The junction between the substrate 10 and the doped well 132 may form a diode D1.

Figure 7:
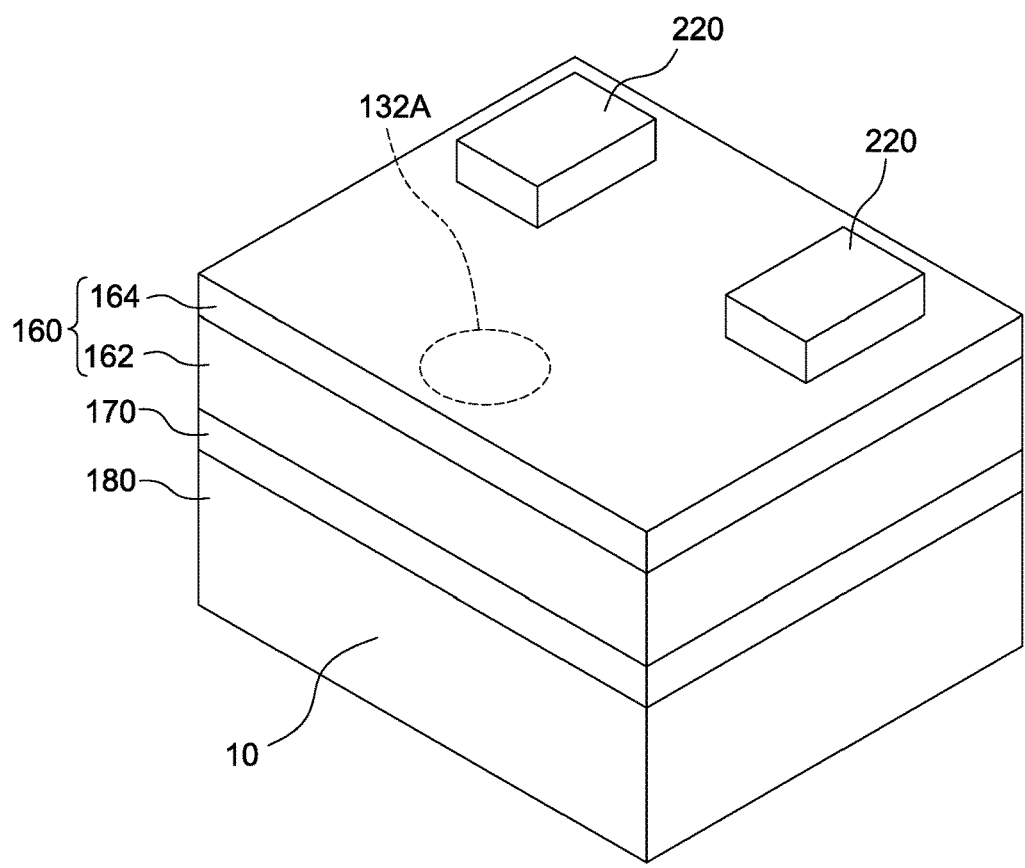
FIG. 7 illustrates a step of a method for manufacturing an electronic device in accordance with some embodiments of the present disclosure.

As shown in FIG. 7, electrodes 220 may be formed on the semiconductor heterostructure layer 160. The electrodes 220 may be formed by sputtering, PVD or other suitable processes.

Figure 8A:
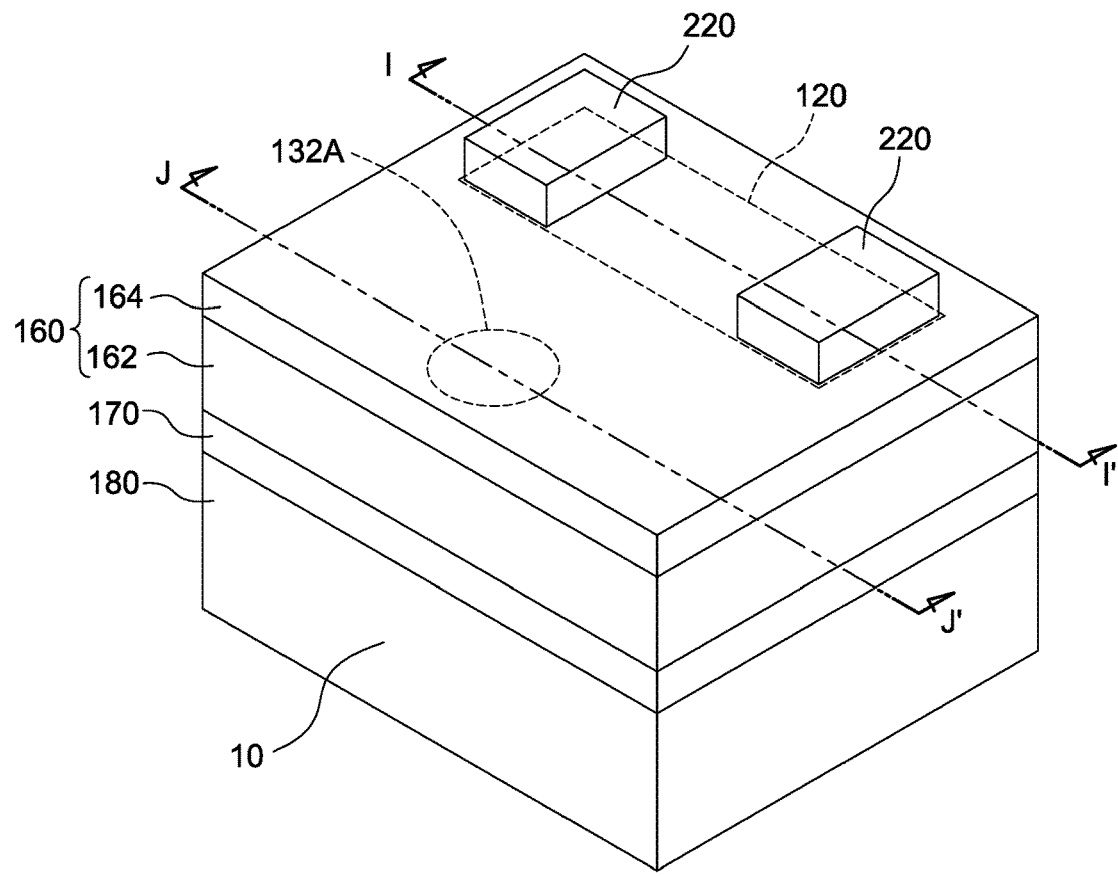
FIG. 8A illustrates a step of a method for manufacturing an electronic device in accordance with some embodiments of the present disclosure.
Figure 8B:
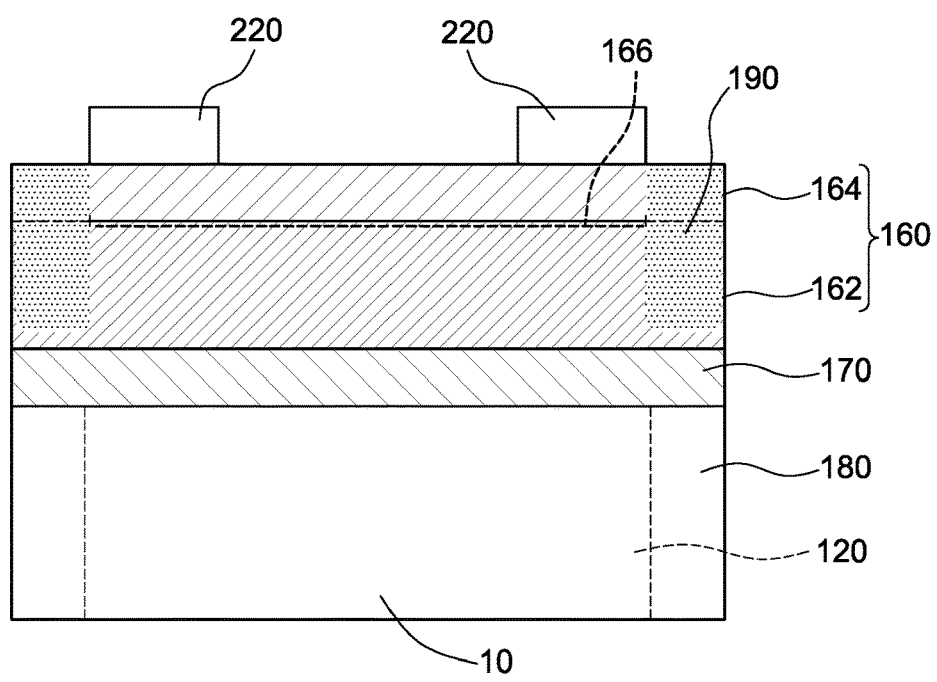
FIG. 8B illustrates a cross-sectional view of FIG. 8A along line I-I'.

Referring to FIG. 8A, dopants are implanted into a portion of semiconductor heterostructure layer 160 above the region 180 of the substrate 10. FIG. 8B illustrates a cross-sectional view of FIG. 8A along line I-I'. The dopants may be implanted into the nitride semiconductor layer 162 in the implanted region 190. The dopants may be implanted into the nitride semiconductor layer 164 in the implanted region 190. The dopants may be implanted into both the nitride semiconductor layer 162 and the nitride semiconductor layer 164 in the implanted region 190. The dopants in the implanted area may have a doping concentration in a range from approximately $1\times10^{12}$ cm$^{-2}$ to approximately $1\times10^{16}$ cm$^{-2}$.

The semiconductor heterostructure layer 160 above the region 120 of the substrate 10 is not implanted with dopants. The heterojunction between the nitride semiconductor layer 162 and nitride semiconductor layer 164 may cause a polarization between the nitride semiconductor layer 162, and the nitride semiconductor layer 164 can form 2DEG 166.

Figure 8C:
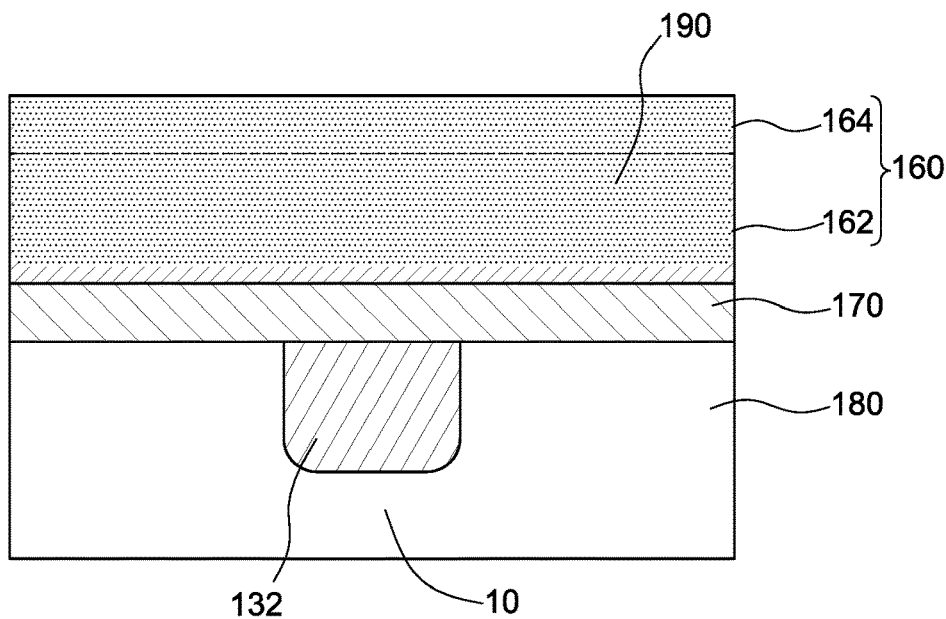
FIG. 8C illustrates a cross-sectional view of FIG. 8A along line J-J'.

FIG. 8C illustrates a cross-sectional view of FIG. 8A along line J-J'. The doped well 132 is under the implanted region 190 of the semiconductor heterostructure layer 160. The implanted region 190 may be above the doped well 132.

Figure 9A:
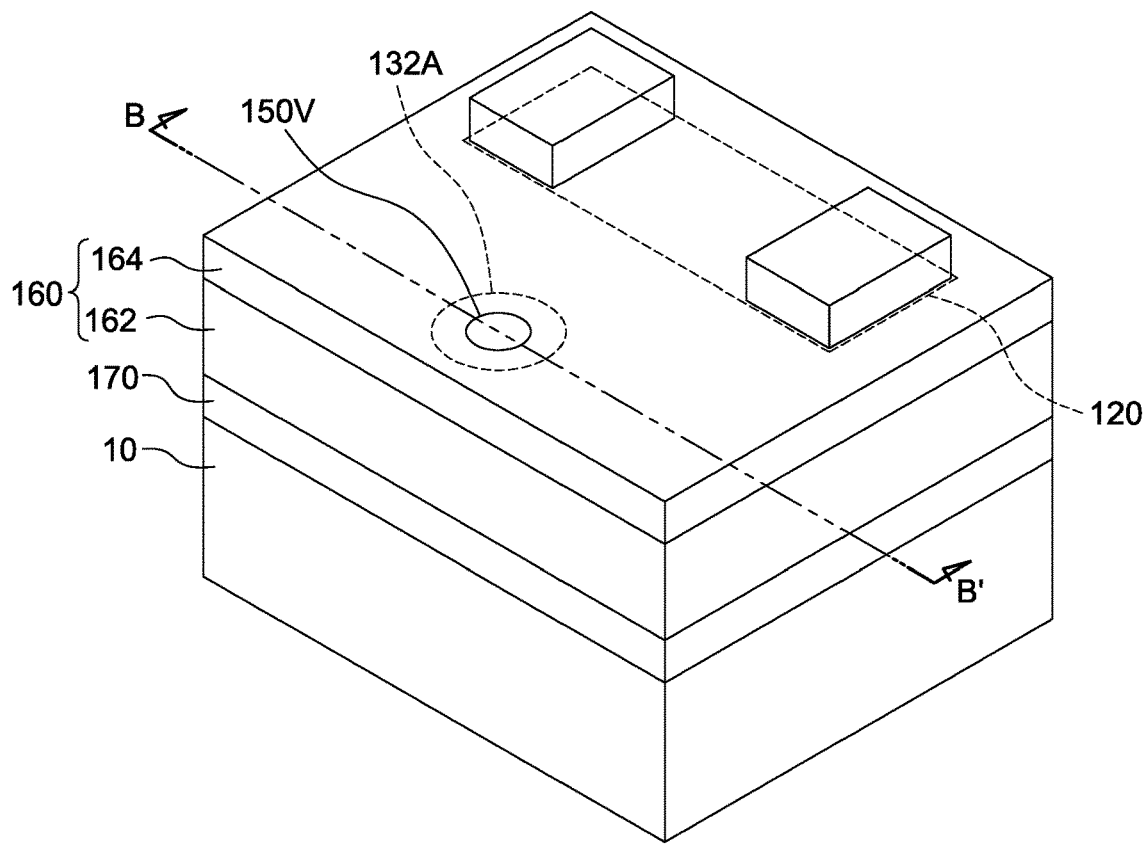
FIG. 9A illustrates a step of a method for manufacturing an electronic device in accordance with some embodiments of the present disclosure.

As shown in FIG. 9A, a via 150V is formed on the area 132A. The via can be formed by, for example, but is not limited to, etching or other suitable techniques. The etching technique may include, for example, but is not limited to, dry etching, such as anisotropic etching.

Figure 9B:
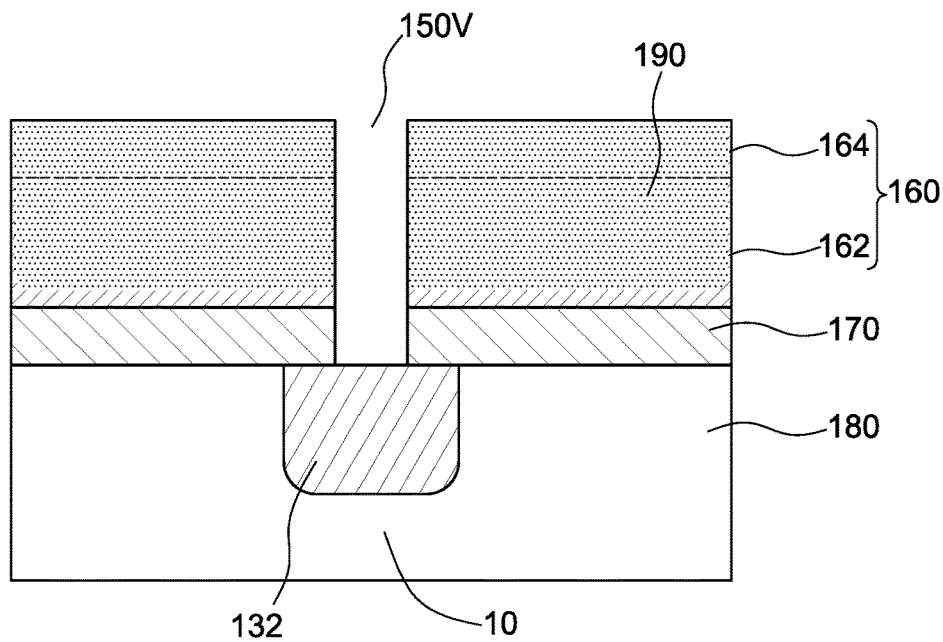
FIG. 9B illustrates a cross-sectional view of FIG. 9A along line B-B'.

FIG. 9B illustrates a cross-sectional view of FIG. 9A along line B-B'. The via 150 penetrates through the semiconductor heterostructure layer 160 until the first doped well 132. The via 150 can penetrate the implanted region 190.

Figure 10A:
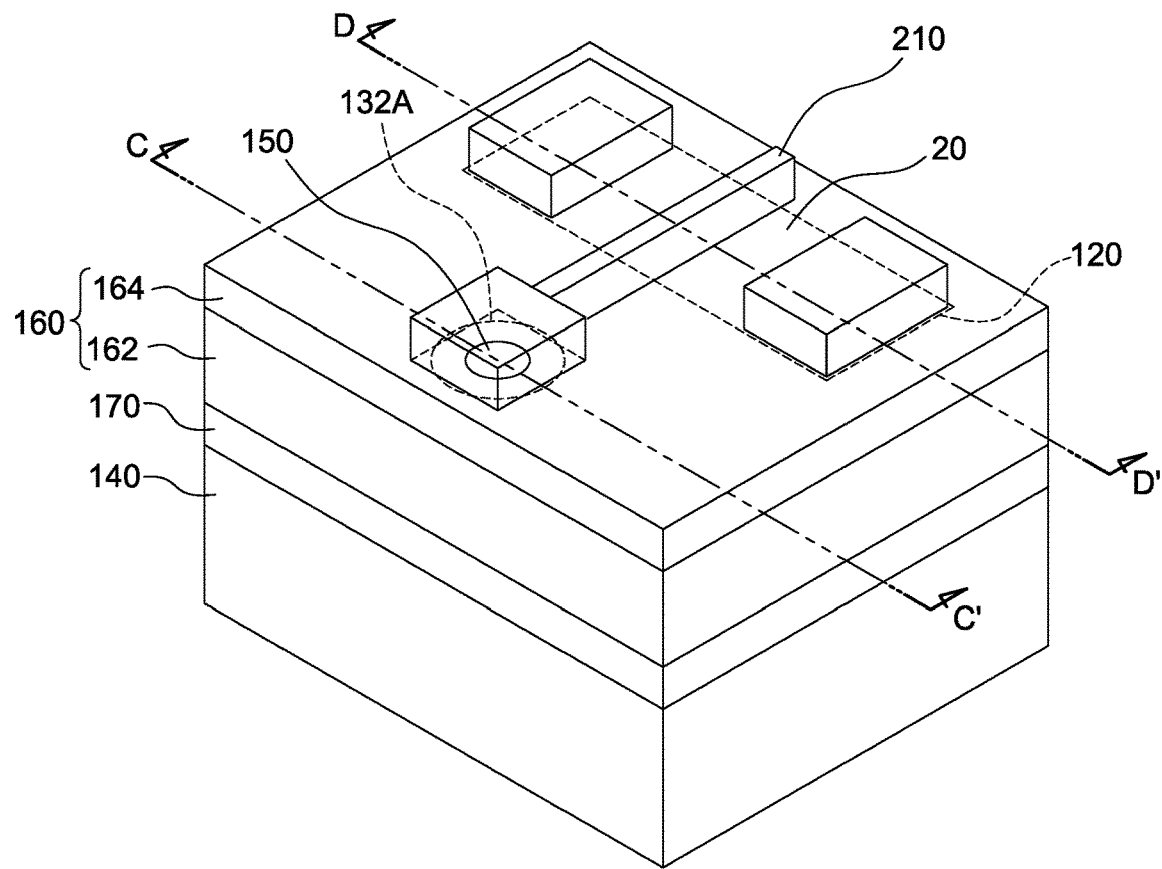
FIG. 10A illustrates a step of a method for manufacturing an electronic device in accordance with some embodiments of the present disclosure.

As shown in FIG. 10A, the via 150V is at least partially filled with conductive material to form an interconnect 150. The electrode 210 of the transistor 20, which is electrically connected to the interconnect 150, may be formed in the same step. The electronic device 1 of FIG. 10A is the same as that of FIG. 1.

Figure 10B:
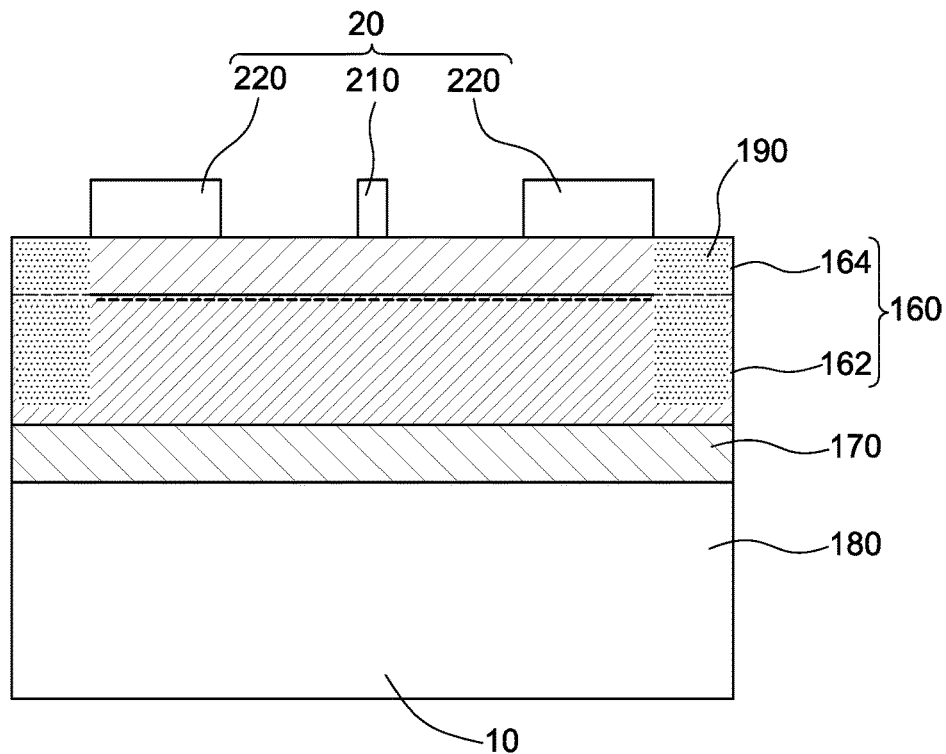
FIG. 10B illustrates a cross-sectional view of FIG. 10A along line D-D'.

FIG. 10B is a cross-sectional view of FIG. 10A along D-D' line.

Figure 10C:
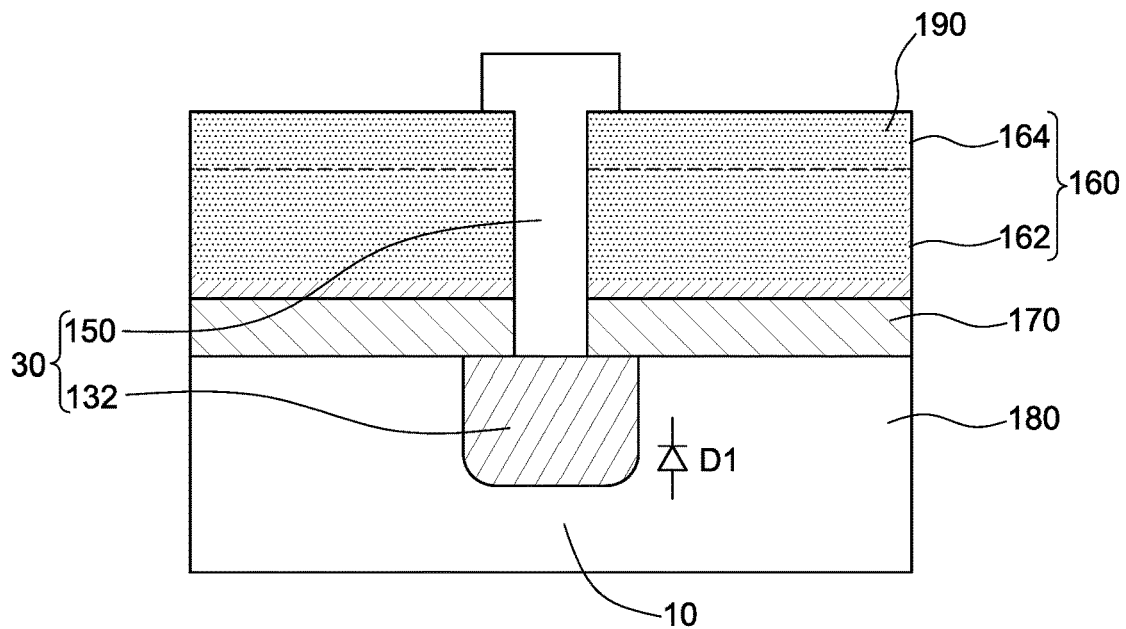
FIG. 10C illustrates a cross-sectional view of FIG. 10A along line C-C'.

FIG. 10C is a cross-sectional view of FIG. 10A along C-C' line.

The via 150V may be fully filled with the conductive material. The interconnect 150 may be formed by a chemical vapor deposition (CVD) process, a physical vapor deposition process (PVD), an atomic layer deposition (ALD) process, and a sputter process or another suitable process. The interconnect 150 electrically connects the doped well 132.

According to the present disclosure, the transistor 20 and the ESD protecting structure 30 can be integratedly formed. Thus, the manufacturing process can be simplified, and the cost can be reduced.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purpose of illustration only, and that practical implementations of the structures described herein can be spatially arranged in any orientation or manner, provided that the merits of the embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood to flexibly include numerical values explicitly specified as limits of a range, but also to include all individual numerical values or sub-ranges encompassed within that range, as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
    a substrate having a first region and a second region different from the first region;
    a transistor disposed on the first region of the substrate, the transistor comprising:
    a first nitride semiconductor layer disposed on the substrate; and
    a second nitride semiconductor layer disposed on the first nitride semiconductor layer and having a bandgap greater than that of the first nitride semiconductor layer; and
    a first doped well in the second region; and
    a second doped well within the first doped well.

2. The semiconductor device of claim 1, wherein the substrate is doped with an impurity different from an impurity of the first doped well.

3. The semiconductor device of claim 1, wherein a first PN junction is formed between the substrate and the first doped well.

4. The semiconductor device of claim 1, wherein the first doped well is electrically connected to an electrode of the transistor by an interconnect penetrating the second nitride semiconductor layer.

5. The semiconductor device of claim 1, wherein the first doped well has an impurity different from an impurity of the second doped well.

6. The semiconductor device of claim 1, wherein a second PN junction is formed between the first doped well and the second doped well.

7. The semiconductor device of claim 1, wherein the first nitride semiconductor layer on the second region of the substrate is doped with an impurity.

8. The semiconductor device of claim 1, wherein the second nitride semiconductor layer on the second region of the substrate is doped with an impurity.

9. The semiconductor device of claim 1, wherein the first doped well comprises a first dopant having a concentration in a range from approximately $10^{13}$ to approximately $10^{18}$ cm$^{-3}$.

10. The semiconductor device of claim 1, wherein the second doped well comprises a second dopant having a concentration in a range from approximately $10^{13}$ to approximately $10^{18}$ cm$^{-3}$.

11. A semiconductor device, comprising:
    a semiconductor substrate;
    a semiconductor heterostructure layer having an implanted area; and
    a first doped well disposed in the semiconductor substrate under the implanted area of the semiconductor heterostructure layer,
    wherein the semiconductor substrate and the first doped well have different type of semiconductors; and
    a second doped well disposed within the first doped well.

12. The semiconductor device of claim 11, wherein the implanted area having a doping concentration in a range from approximately $1 \times 10^{12}$ cm$^{-2}$ to approximately $1 \times 10^{16}$ cm$^{-2}$.

13. The semiconductor device of claim 11, wherein a first PN junction is formed between the semiconductor substrate and the first doped well.

14. The semiconductor device of claim 11, further comprising a first interconnect extending from the first doped well through the semiconductor heterostructure layer.

15. The semiconductor device of claim 11, wherein the first doped well and the second doped well have different dopants.

16. The semiconductor device of claim 11, further comprising a second interconnect extending from the second doped well through the semiconductor heterostructure layer.

17. The semiconductor device of claim 11, wherein the first doped well is formed with a dopant having a concentration in a range from approximately $10^{13}$ to approximately $10^{18}$ cm$^{-3}$.

18. The semiconductor device of claim 11, wherein the second doped well is formed with a dopant having a concentration in a range from approximately $10^{13}$ to approximately $10^{18}$ cm$^{-3}$.

19. A method for manufacturing a semiconductor device, comprising:
    forming a group III nitride semiconductor heterostructure layer on a substrate having a first region,
    implanting a first dopant in the first region of the substrate to form a first doped well;
    implanting a second dopant in the group III nitride semiconductor heterostructure layer above the first region;
    forming a via through the group III nitride semiconductor heterostructure layer till the first doped well;
    at least partially filling the via to form an interconnect for electrically connecting the first doped well; and
    implanting a third dopant into the first doped well to form a second doped well within the first doped well.

* * * * *